(12) United States Patent
Kondo

(10) Patent No.: US 11,581,748 B2
(45) Date of Patent: Feb. 14, 2023

(54) METHODS AND APPARATUS FOR A BATTERY

(71) Applicant: SEMICONDUCTOR COMPONENTS INDUSTRIES, LLC, Phoenix, AZ (US)

(72) Inventor: Hideo Kondo, Oizumi-Machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 446 days.

(21) Appl. No.: 16/846,622

(22) Filed: Apr. 13, 2020

(65) Prior Publication Data

US 2021/0320513 A1    Oct. 14, 2021

(51) Int. Cl.
| | |
|---|---|
| *H02J 7/00* | (2006.01) |
| *G01R 31/3835* | (2019.01) |
| *H01M 10/44* | (2006.01) |
| *H01M 10/42* | (2006.01) |
| *H01M 10/48* | (2006.01) |

(52) U.S. Cl.
CPC ...... *H02J 7/00306* (2020.01); *G01R 31/3835* (2019.01); *H01M 10/425* (2013.01); *H01M 10/448* (2013.01); *H01M 10/48* (2013.01); *H02J 7/0031* (2013.01); *H02J 7/0048* (2020.01); *H01M 2010/4271* (2013.01); *H01M 2010/4278* (2013.01)

(58) Field of Classification Search
None
See application file for complete search history.

(56) References Cited

U.S. PATENT DOCUMENTS

| | | | |
|---|---|---|---|
| 2007/0139015 A1 | 6/2007 | Seo | |
| 2013/0033233 A1* | 2/2013 | Noda | H01M 10/44 320/135 |
| 2015/0274022 A1 | 10/2015 | Nakasako | |
| 2015/0293183 A1 | 10/2015 | Tenmyo | |
| 2018/0366057 A1* | 12/2018 | Shen | G09G 3/32 |

* cited by examiner

*Primary Examiner* — Arun C Williams
(74) *Attorney, Agent, or Firm* — Dickinson Wright PLLC

(57) ABSTRACT

Various embodiments of the present technology may provide methods and apparatus for a battery. The apparatus may be configured to prevent leakage current from the battery to a number of sub-systems by selectively operating switches that connect the battery to the sub-systems. Operation of the switches may be based on whether the battery is charging or discharging and the capacity of the battery.

19 Claims, 5 Drawing Sheets

METHODS AND APPARATUS FOR A BATTERY

BACKGROUND OF THE TECHNOLOGY

Battery-powered devices typically provide a rechargeable battery to power a number of sub-systems. Excessive discharge (over-discharge) of the rechargeable battery may lead to dangerous operating conditions, such as fire and explosion. Even if the device and battery are not in active use, over time, if the battery is not being charged, current may leak from the battery to the other sub-systems resulting in an over-discharge condition.

SUMMARY OF THE INVENTION

Various embodiments of the present technology may provide methods and apparatus for a battery. The apparatus may be configured to prevent leakage current from the battery to a number of sub-systems by selectively operating switches that connect the battery to the sub-systems. Operation of the switches may be based on whether the battery is charging or discharging and the capacity of the battery.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, timers, memory devices, signal converters, semiconductor devices, such as transistors and capacitors, and the like, which may carry out a variety of functions.

Figure 1:
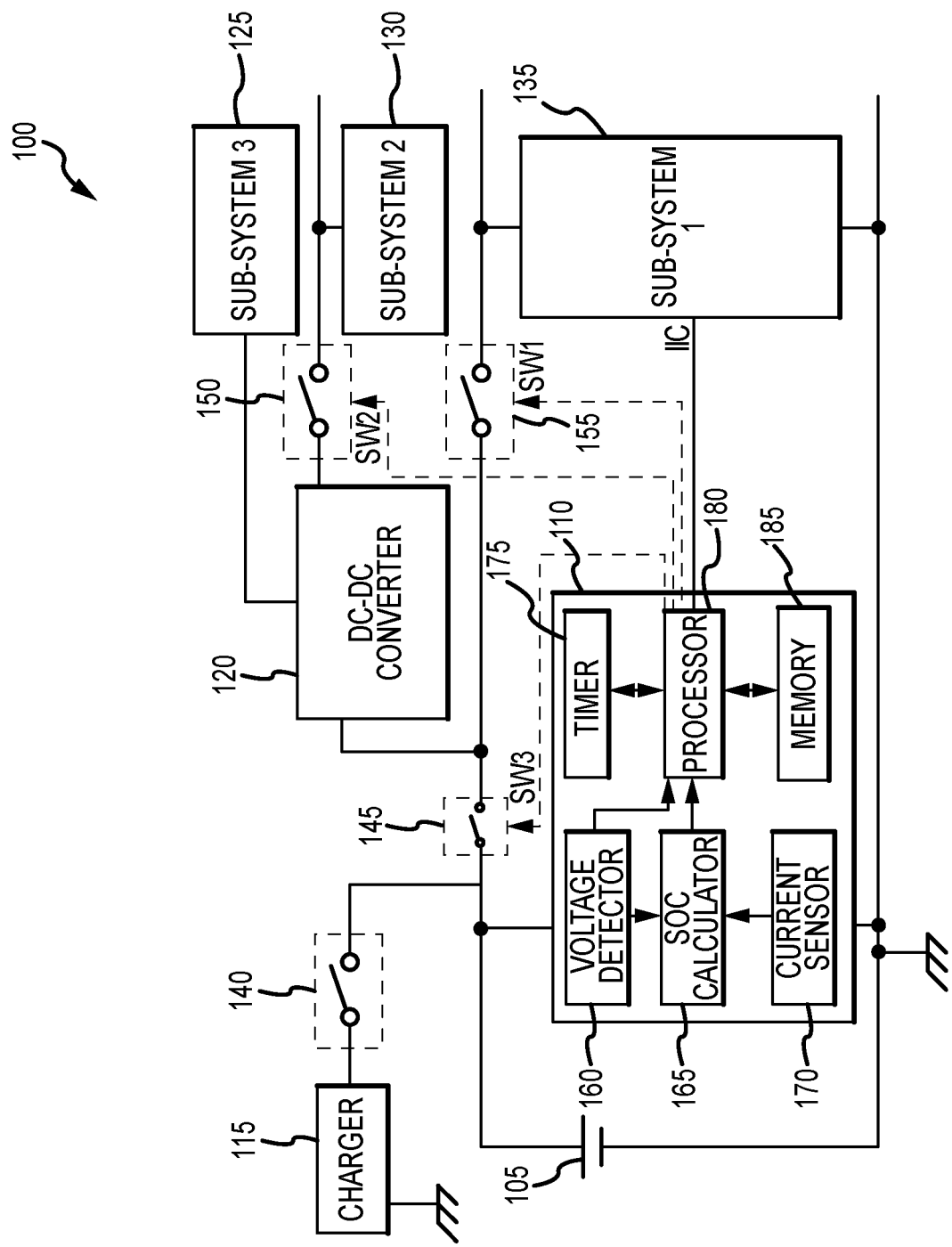
FIG. 1 is a block diagram of a system in accordance with an exemplary embodiment of the present technology.
Figure 2:
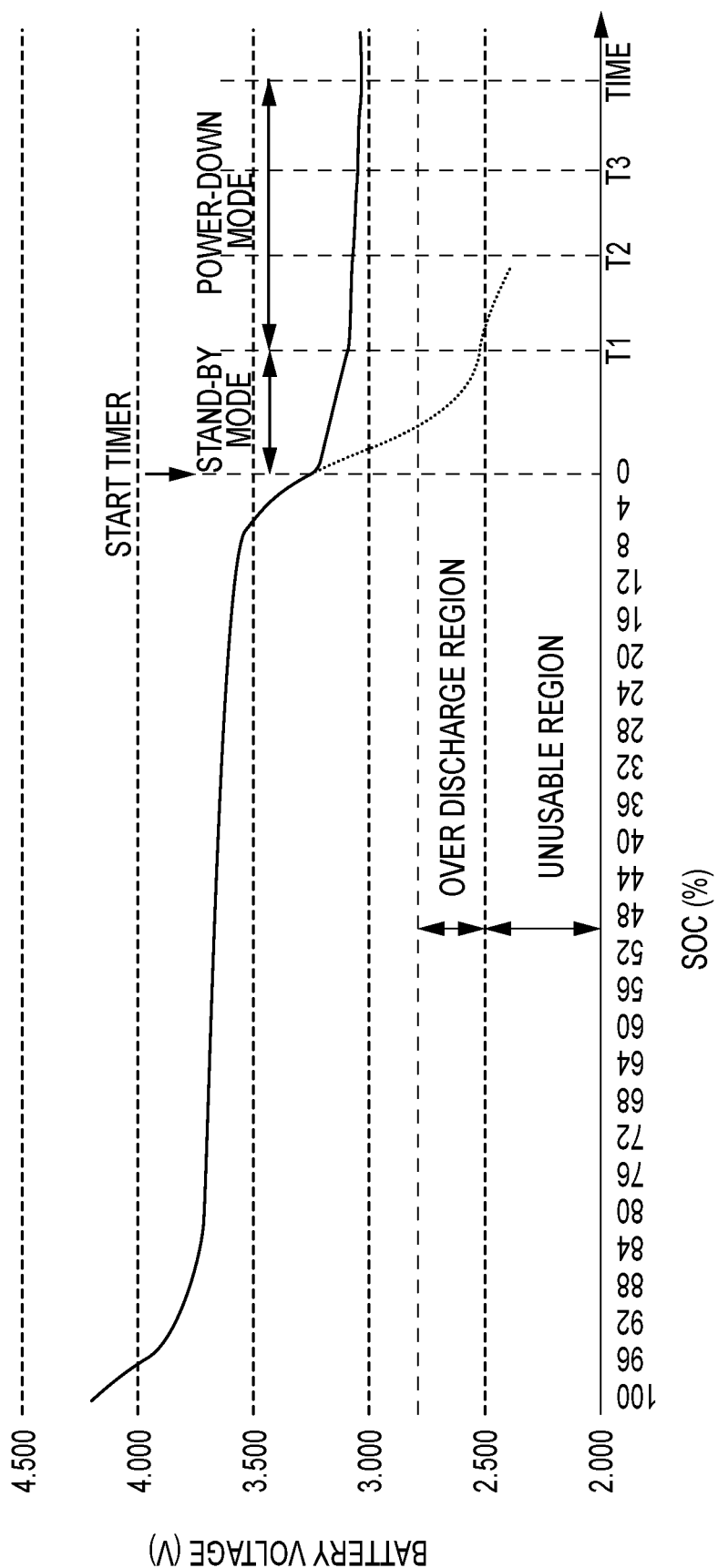
FIG. 2 is a graph of battery voltage in accordance with an exemplary embodiment of the present invention.
Figure 3:
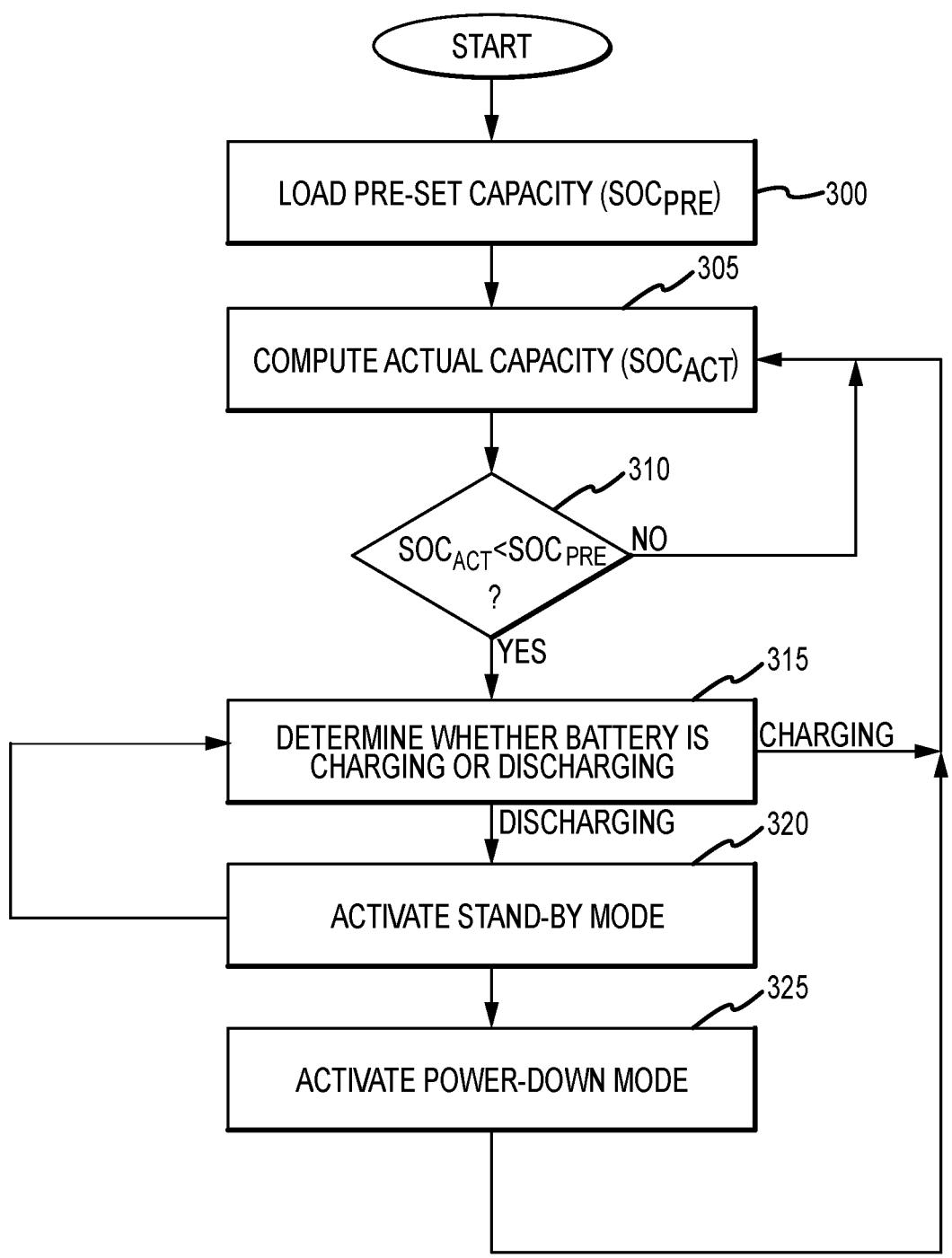
FIG. 3 is a flowchart for preventing over-discharge of a battery in accordance with an exemplary embodiment of the present invention.
Figure 4:
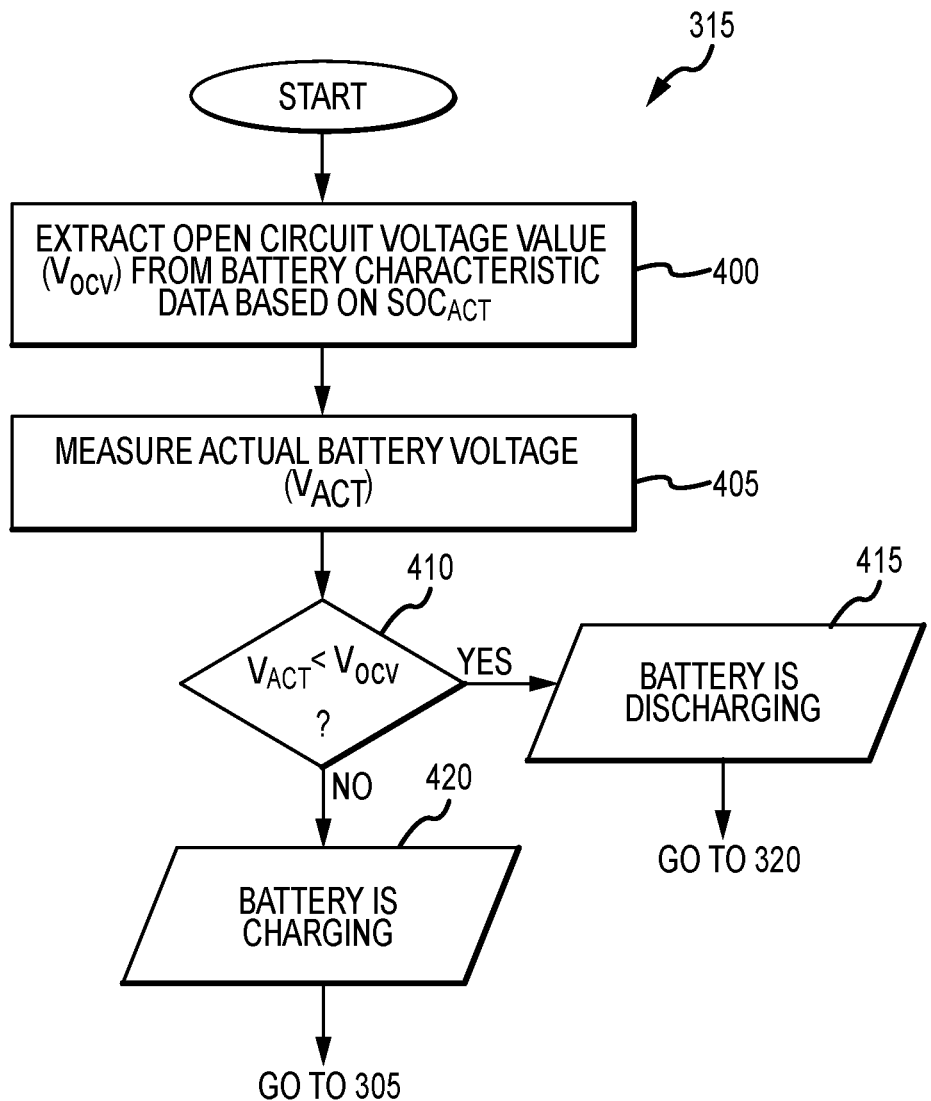
FIG. 4 illustrates a reference table in accordance with an exemplary embodiment of the present invention.

Methods and apparatus for a battery according to various aspects of the present technology may operate in conjunction with any suitable battery-powered electronic system and/or device, such as "smart devices," wearables, consumer electronics, portable devices, medical devices, e-cigarettes, and the like. Referring to FIG. 1, an exemplary system 100 may be integrated in an electronic device (not shown), such as an audio headset. The system 100 may further comprise a rechargeable battery 105, a fuel gauge circuit 110, and a charger 115. The system 100 may further comprise any number of sub-systems, such as a first sub-system 135, a second sub-system 130, and a third sub-system 125. Each sub-system may be responsible for a particular function within the electronic device and may comprise any number of circuits and/or devices. For example, in the case of a smart watch, the first sub-system 135 may used to calculate health data and include a number of sensors, such as a pedometer for collecting/tracking motion, a pulse oximeter to measure blood oxygen levels, a heart rate monitor, and the like. The second sub-system 130 may control display functions of the watch (e.g., LED and/or AM-OLED) and wireless communication, and the third sub-system 125 may be used to detect touch keys and button inputs on the watch and provide security authentication.

The system 100 may further comprise a number of switches, such as a first switch 155, a second switch 150, and a third switch 145. In an exemplary embodiment, each sub-system is provided with a corresponding switch. As such, the number of switches is commensurate with the number of sub-systems. The first switch 155 may be connected between the battery 105 and the first sub-system 135 and may selectively allow or prevent current flow from the battery 105 to the first sub-system 135. The second switch 150 may be connected between the battery 105 and the second sub-system 130 and may selectively allow or prevent current flow from the battery 105 to the second sub-system 130. The third switch 145 may be connected between the battery 105 and the third sub-system 125 and may selectively allow or prevent current flow from the battery 105 to all sub-systems, including the third sub-system 125. Each switch 145, 150, 155 may comprise any circuit and/or device suitable for controlling current flow, such as a field-effect transistor.

The system 100 may further comprise a DC-DC converter 120. In an exemplary embodiment, the DC-DC converter 120 may be connected between the third switch 145 and the third sub-system 125, as well as between the third switch 145 and the second sub-system 130 (via the second switch 150). The DC-DC converter 120 may comprise any circuit and/or device suitable for converting the voltage of a DC supply to a higher voltage or a lower voltage. In an exemplary embodiment, the DC-DC converter 120 converts the voltage of the battery 105 to a voltage suitable for powering the third sub-system 125 and second sub-system 130.

The charger 115 may be configured to control charging of the battery 105. The charger 115 may be configured to physically connect/disconnect to/from the battery 105 (represented by a switch 140). The charger 115 may comprise any circuit and/or system suitable for controlling current supplied to the battery 105 for the purpose of charging the battery 105.

The fuel gauge circuit 110 may be configured to selectively operate the switches (e.g., switches 145, 150, and 155) to prevent current from leaking from the battery 105 to the sub-systems (e.g., sub-systems 125, 130, 135) during a period of non-use (i.e., the battery 105 is not charging or actively discharging—active discharging may be defined as periods of time or instances when the sub-systems are actively drawing current from the battery 105 due to actions by a user of the electronic device). The fuel gauge circuit 110 may use various battery parameters and measurements, such as a measured battery voltage and a computed battery capacity, to determine whether and when to open/close the first, second, and third switches 155, 150, 145. Operation of the switches 155, 150, 145 may also be based on whether the battery is charging or discharging. In an exemplary embodiment, the fuel gauge circuit 110 may comprise a voltage detector 160, a capacity calculator 165, a current sensor 170, a timer 175, a memory 185, and a processor 180.

The voltage detector 160 may measure a voltage of the battery 105. The voltage detector 160 may be connected to the battery 105 and may comprise any circuit and/or device suitable for measuring a voltage. The voltage detector 160 may be configured to transmit the measured voltage to the capacity calculator 165 and/or the processor 180.

The current sensor 170 may be configured to sense or otherwise measure a current of the battery 105. The current sensor 170 may comprise any circuit and/or device suitable for measuring the current of the battery 105. For example, the current sensor 170 may operate in conjunction with a sense resistor (not shown), wherein the current sensor 170 measures the voltage across the sense resistor to determine the current. The current sensor 170 may be configured to transmit the measured current to the capacity calculator 165 and/or the processor 180.

The capacity calculator 165 (also referred to as an SOC calculator) may be configured to compute a capacity of the battery 105. The capacity of the battery 105 is a measure of the charge stored by the battery 105 and represents the maximum about of energy that can be extracted from the battery 105 under certain specified conditions. The capacity of the battery 105 may be represented in ampere-hours or may be expressed as a percentage and referred to as a state of charge (SOC). The capacity calculator 165 may be configured to receive voltage information from the voltage detector 160 and compute the capacity using a conventional "voltage method." Alternatively, the capacity calculator 165 may be configured to receive current information from the current sensor 170 and compute the capacity using a convention "coulomb counting method." The capacity calculator 165 may transmit the computed capacity to the processor 180.

The timer 175 may be configured to measure an elapsed time by incrementing in value. Each count may be equivalent to 1 second (s). The timer 175 may comprise any device and/or system suitable for counting and that may be started, stopped, and/or reset at any time.

Figure 5:
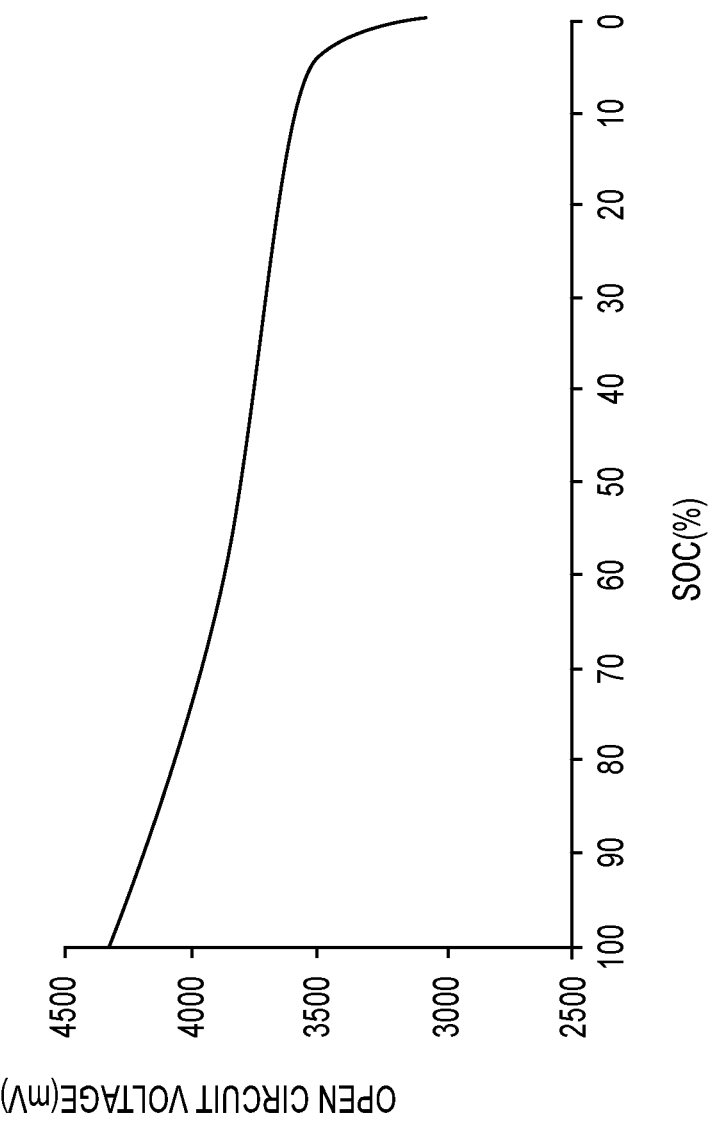
FIG. 5 is a graph of open circuit voltage values as a function of capacity in accordance with an exemplary embodiment of the present invention.

The memory 185 may be configured to store various data, such as a known battery characteristic data and pre-set (pre-determined) values, such as a pre-set capacity value $SOC_{PRE}$. The pre-set value $SOC_{PRE}$ may be selected according to the particular characteristics of the battery 105 and/or the application of the system 100. In general, the pre-set capacity value $SOC_{PRE}$ may be in the range of 0% to 5%. The battery characteristic data may indicate a relationship between open circuit voltage values and capacity for the battery 105 (e.g., as illustrated in FIG. 5). The battery characteristic data may be stored in a look-up table or other suitable form.

The memory 205 may comprise any number or type of storage devices, such as registers, ROM (read only memory), RAM (random access memory), and the like.

The processor 180 configured to receive various battery data, such as a measured battery voltage from the voltage detector 160 and a measured capacity from the capacity calculator 165. The processor 180 may be further configured to communicate with the timer 175. For example, the processor 180 may transmit control signals to the timer 175 to start, stop, or reset the timer 175, and the processor 180 may receive or otherwise retrieve the elapsed time value from the timer 175.

The processor 180 may be further configured to communicate with the memory 185. For example, the processor 180 may receive or retrieve relevant data from the memory 185, such as the pre-set capacity value $SOC_{PRE}$ and open circuit voltage values from the battery characteristic data.

In operation, and referring to FIGS. 1-4, the system 100 may be configured to detect when the actual (measured) capacity ($SOC_{ACT}$) of the battery 105 is less than the pre-set capacity value $SOC_{PRE}$. If the battery 105 is discharging and the measure capacity is less than the pre-set capacity value $SOC_{PRE}$, the system 100 may be configured to prevent further discharge (and current flow) from the battery 105 to the sub-systems 135, 130, 125 by opening the switches 145, 150, 155 in a sequenced order.

In an exemplary operation, and referring to FIGS. 1-5, the system 100 may be provided with the desired pre-set capacity value $SOC_{PRE}$ (300). For example, the memory 185 may be loaded with a pre-set capacity value $SOC_{PRE}$ in the range of 0% to approximately 5%. The system 100 may then compute the actual capacity $SOC_{ACT}$ of the battery 105 (305). For example, the capacity calculator 165 may use voltage data from the voltage detector 160 to compute the actual capacity $SOC_{ACT}$ using a conventional voltage method. Alternatively, the capacity calculator 165 may use current data from the current sensor 170 to compute the actual capacity $SOC_{ACT}$ using a conventional coulomb counting method.

The system 100 may then compare the actual capacity $SOC_{ACT}$ and the pre-set capacity $SOC_{PRE}$ (310). For example, the processor 180 may retrieve the pre-set capacity $SOC_{PRE}$ from the memory 185 and receive the actual capacity $SOC_{ACT}$ from the capacity calculator 165 and determine whether the actual capacity $SOC_{ACT}$ is less than the pre-set capacity value $SOC_{PRE}$. If the actual capacity $SOC_{ACT}$ is not less than the pre-set capacity value $SOC_{PRE}$, then the system 100 may compute a new actual capacity. If the actual capacity $SOC_{ACT}$ is less than the pre-set capacity $SOC_{PRE}$, then the system 100 may determine whether the battery 105 is charging or discharging (315).

In one embodiment, determining whether the battery 105 is charging or discharging comprises extracting an open circuit voltage value ($V_{OCV}$) from the battery characteristic data based on the actual capacity $SOC_{ACT}$ (400). For example, the processor 180 may receive the actual capacity value $SOC_{ACT}$ from the capacity calculator 165 and retrieve (extract) the open circuit voltage value $V_{OCV}$ from the battery characteristic data that corresponds to the actual capacity $SOC_{ACT}$. For example, and referring to FIG. 5, if the actual capacity $SOC_{ACT}$ is 5%, then the corresponding open circuit voltage $V_{OCV}$ is 3500 mV.

Determining whether the battery 105 is charging or discharging may further comprise measuring the actual battery voltage ($V_{ACT}$) (405). For example, the voltage detector 405 may measure the actual battery voltage $V_{ACT}$ and report the value to the processor 180. The system 100 may then compare the actual battery voltage $V_{ACT}$ to the extracted open circuit voltage value $V_{OCV}$. For example, the processor 180 may determine whether the actual battery voltage $V_{ACT}$ is less than the extracted open circuit voltage $V_{OCV}$. If the actual battery voltage $V_{ACT}$ is less than the extracted open circuit voltage $V_{OCV}$, then the processor 180 may conclude that the battery 105 is discharging (415) and the fuel gauge circuit 110 may activate a stand-by mode (320). If the actual battery voltage $V_{ACT}$ is not less than the extracted open circuit voltage $V_{OCV}$, then the processor 180 may conclude that the battery 105 is charging (420) and compute a new capacity value (305).

Activating the stand-by mode may be defined by a pre-determined first wait time T1 (e.g., 4 minutes), and may comprise starting the timer 175 and waiting until the first wait time T1 has elapsed. During the stand-by mode, the processor 180 may continue to determine whether the battery 105 is charging or discharging. Further, the fuel gauge circuit 110 may remain in the stand-by mode as long as processor 180 determines that the battery 105 is discharging. The fuel gauge circuit 110 may terminate the stand-by mode if the processor 180 determines that the battery 105 has begun charging.

The length of time of the stand-by mode (predetermined first wait time T1) may be selected to ensure that the voltage of the battery 105 does not enter an "over-discharge" state and may depend on the pre-set capacity value $SOC_{PRE}$. For example, a system with a higher pre-set capacity value may provide a longer stand-by time, while a system with a lower pre-set capacity value may provide a shorter stand-by time. In general, battery capacity is commensurate with time. In other words, if the battery is charging, the battery capacity increases as time elapses, and if the battery is discharging, the battery capacity decreases as time elapses. In an exemplary embodiment, a battery with a voltage below 2.7V (or in the range of 2.5V to 2.7V) may be considered to be "over-discharged." In addition, a battery with a voltage below 2.5V may be considered to be "unusable" and possibly dangerous—when a battery enters the unusable voltage range, fire and explosion may result.

After the predetermined first wait time T1 has elapsed, the processor 180 may activate the power-down mode (325). The power-down mode may comprise selectively opening the first, second, and third switches 155, 150, 145 in a sequenced order. For example, if the battery 105 is discharging, the actual capacity value $SOC_{ACT}$ is less than the pre-set capacity value $SOC_{PRE}$, and the predetermined first wait time T1 has elapsed, then the processor 180 may generate a first control signal SW1 and transmit the first control signal SW1 to the first switch 155, wherein the first control signal SW1 opens the first switch 155 to prevent current from flowing/leaking from the battery 105 to the first sub-system 135. The first control signal SW1 may comprise a low value and a high value (e.g., logic value "0" and logic value "1"). In an exemplary embodiment, a low value control signal opens (turns OFF) the first switch 155.

After a predetermined second wait time T2 has elapsed, if the battery 105 is discharging and the actual capacity value $SOC_{ACT}$ is less than the pre-set capacity value $SOC_{PRE}$, then the processor 180 may generate a second control signal SW2 and transmit the second control signal SW2 to the second switch 150, wherein the second control signal SW2 opens the second switch 150 to prevent current from flowing/leaking from the battery 105 to the second sub-system 130. The second control signal SW2 may comprise a low value and a high value (e.g., logic value "0" and logic value "1"). In an exemplary embodiment, a low value control signal opens the second switch 150.

After a predetermined third wait time T3 has elapsed, if the battery 105 is discharging and the actual capacity value $SOC_{ACT}$ is less than the pre-set capacity value $SOC_{PRE}$, then the processor 180 may generate a third control signal SW3 and transmit the third control signal SW3 to the third switch 145, wherein the third control signal SW3 opens the third switch 145 to prevent current from flowing/leaking from the battery 105 to the third sub-system 135. The third control signal SW3 may comprise a low value and a high value (e.g., logic value "0" and logic value "1"). In an exemplary embodiment, a low value control signal opens the third switch 155.

During the power-down mode, the processor 180 may also continue to monitor/measure the actual voltage $V_{ACT}$ of the battery 105 and determine whether the battery 105 has started charging (as described above). If the processor 180 determines that the battery 105 is charging, the processor 180 may generate the first, second, and third control signals SW1, SW2, SW3 with high values to close (turn ON) the first, second, and third switches 155, 150, 145.

In various embodiments, together, the stand-by mode and the power-down mode may prevent current from leaking from the battery 105 to the sub-systems and, thus prevent the voltage of the battery 105 from descending into the over-discharge condition. For example, and referring to FIG. 2, in an open circuit condition (when the battery 105 is not charging or actively discharging), the battery voltage (shown in a solid line) does not enter the over-discharge voltage range. In contrast, without the stand-by mode and power-down mode, the battery voltage (shown in a hashed line) may enter the over-discharge voltage range. It should be noted that the over-discharge range and battery voltage values are for illustrative purposes only and the actual values that define the over-discharge range will vary based on the type and actual characteristics of the battery.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus capable of connecting to a battery and a sub-system, comprising:
a fuel gauge circuit comprising:
a memory configured to store known battery characteristic data and a pre-set capacity value;
a timer configured to generate a time count value;
a sub-circuit configured to compute a capacity of the battery; and
a processor in communication with a voltage detector, the memory, the sub-circuit, and the timer; wherein the processor is configured to:
compare the computed capacity to the pre-set capacity;
enable the timer if the computed capacity is less than the pre-set capacity; and
generate a first control signal when the timer reaches a predetermined time count value; and
a switch connected between the battery and the sub-system, wherein the switch opens in response to the first control signal.

2. The apparatus according to claim 1, wherein the fuel gauge further comprises: the voltage detector configured to measure a voltage of the battery.

3. The apparatus according to claim 2, wherein the processor is further configured to determine whether the battery is charging based on:
the measured voltage;
the computed capacity; and
the battery characteristic data.

4. The apparatus according to claim 3, wherein the processor is further configured to generate a second control signal if the battery is charging.

5. The apparatus according to claim 4, wherein the switch closes in response to the second control signal.

6. The apparatus according to claim 1, wherein the known battery characteristic data comprises open circuit voltage values as a function of capacity.

7. The apparatus according to claim 2, wherein the processor is further configured to determine whether the battery is discharging based on the measured voltage, the computed capacity, and the battery characteristic data.

8. The apparatus according to claim 7, wherein the processor is further configured to enable the timer if:
the computed capacity is less than the pre-set capacity; and
the battery is discharging.

9. A method for preventing over-discharge of a battery connected to a sub-system, comprising:
compute a capacity of the battery;
compare the computed capacity to a pre-set capacity;
determine whether the battery is discharging, based on measuring a voltage of the battery, determining an open circuit voltage value based on the computed capacity, and comparing the measured voltage and the open circuit voltage value;
activate a stand-by mode if the battery is discharging and the computed capacity is less than the pre-set capacity; and
upon completion of the stand-by mode, activate a power-down mode if the battery is discharging and the computed capacity is less than the pre-set capacity.

10. The method according to claim 9, wherein activating the stand-by mode comprises counting an elapsed time until the elapsed time reaches a predetermined value.

11. The method according to claim 9, wherein activating the power-down mode comprises preventing current flow from the battery to the sub-system.

12. A method for preventing over-discharge of a battery connected to a sub-system, comprising:
compute a capacity of the battery;
compare the computed capacity to a pre-set capacity;
determining whether the battery is charging by measuring a voltage of the battery, determining an open circuit voltage value based on the computed capacity, and comparing the measured voltage and the open circuit voltage value;
determine whether the battery is discharging;
activate a stand-by mode if the battery is discharging and the computed capacity is less than the pre-set capacity;
upon completion of the stand-by mode, activate a power-down mode if the battery is discharging and the computed capacity is less than the pre-set capacity.

13. The method according to claim 12, further comprising deactivating the power-down mode if the battery is charging.

14. A system, comprising:
a battery selectively connected to:
a first sub-system via a first switch; and
a second sub-system via a second switch; and
a fuel gauge circuit connected to the battery and comprising:
a memory configured to store known battery characteristic data and a pre-set capacity value;
a timer configured to generate a time count value;
a sub-circuit configured to compute a capacity of the battery; and
a processor in communication with a voltage detector, the memory, the sub-circuit, and the timer; wherein the processor is configured to:
compare the computed capacity to the pre-set capacity;
enable the timer if the computed capacity is less than the pre-set capacity and the battery is discharging;
open the first switch when the timer reaches a first predetermined time count value; and
open the second switch when the timer reaches a second predetermined time count value.

15. The system according to claim 14, wherein the fuel gauge further comprises: the voltage detector configured to measure a voltage of the battery.

16. The system according to claim 15, wherein the processor is further configured to determine whether the battery is charging or discharging based on the measured voltage, the computed capacity, and the battery characteristic data.

17. The system according to claim 16, wherein the processor is further configured to close the first switch and the second switch if the battery is charging.

18. The system according to claim 14, wherein the known battery characteristic data comprises open circuit voltage values as a function of capacity.

19. The system according to claim 14, wherein the pre-set capacity value is in a range of 0% to 5%.

* * * * *